(12) United States Patent
Su et al.

(10) Patent No.: US 12,396,099 B2
(45) Date of Patent: Aug. 19, 2025

(54) POWER BOARD DESIGN TO ACCOMMODATE UNIVERSAL PLUG TYPES VIA BRIDGE SHEET METAL DESIGNS

(71) Applicant: PLUME DESIGN, INC., Palo Alto, CA (US)

(72) Inventors: Ming-Tsung Su, Taipei (TW); Chun-Wen Wang, Taoyuan (TW)

(73) Assignee: PLUME DESIGN, INC., Palo Alto, CA (US)

( * ) Notice: Subject to any disclaimer, the term of this patent is extended or adjusted under 35 U.S.C. 154(b) by 272 days.

(21) Appl. No.: 18/349,297

(22) Filed: Jul. 10, 2023

(65) Prior Publication Data

US 2025/0024603 A1 Jan. 16, 2025

(51) Int. Cl.
*H05K 1/11* (2006.01)
*H05K 3/30* (2006.01)

(52) U.S. Cl.
CPC ............. *H05K 1/117* (2013.01); *H05K 3/308* (2013.01); *H05K 2201/10189* (2013.01)

(58) Field of Classification Search
CPC . H05K 1/11; H05K 3/30; H05K 1/117; H05K 3/308; H05K 2201/10189
USPC ........................................................ 361/760
See application file for complete search history.

(56) References Cited

U.S. PATENT DOCUMENTS

| 2012/0129405 A1 | 5/2012 | Keshet et al. |
| 2016/0036238 A1 | 2/2016 | Hsu |
| 2017/0105272 A1 | 4/2017 | Johnson |
| 2020/0328586 A1 | 10/2020 | Eriksen et al. |

FOREIGN PATENT DOCUMENTS

EP 4383957 A1 6/2024

OTHER PUBLICATIONS

International Search Report and Written Opinion to corresponding Int'l Appln. No. PCT/US24/36863 mailed Oct. 1, 2024 (11 pages).

*Primary Examiner* — Tremesha W Burns
(74) *Attorney, Agent, or Firm* — Nicholas Martin; Greenberg Traurig, LLP

(57) ABSTRACT

Wireless communication devices may include a printed circuit board and a conductive pin structure. The printed circuit board may include a neutral power input and a live power input positioned at a first distance from each other. The conductive pin structure may include a neutral pin and a live pin positioned at a second, different distance from each other. A first sheet metal connector may electrically connect the neutral pin to the neutral power input and a second sheet metal connector may electrically connect the live pin to the live power input. Various other related devices, components, systems, and methods are also disclosed.

20 Claims, 6 Drawing Sheets

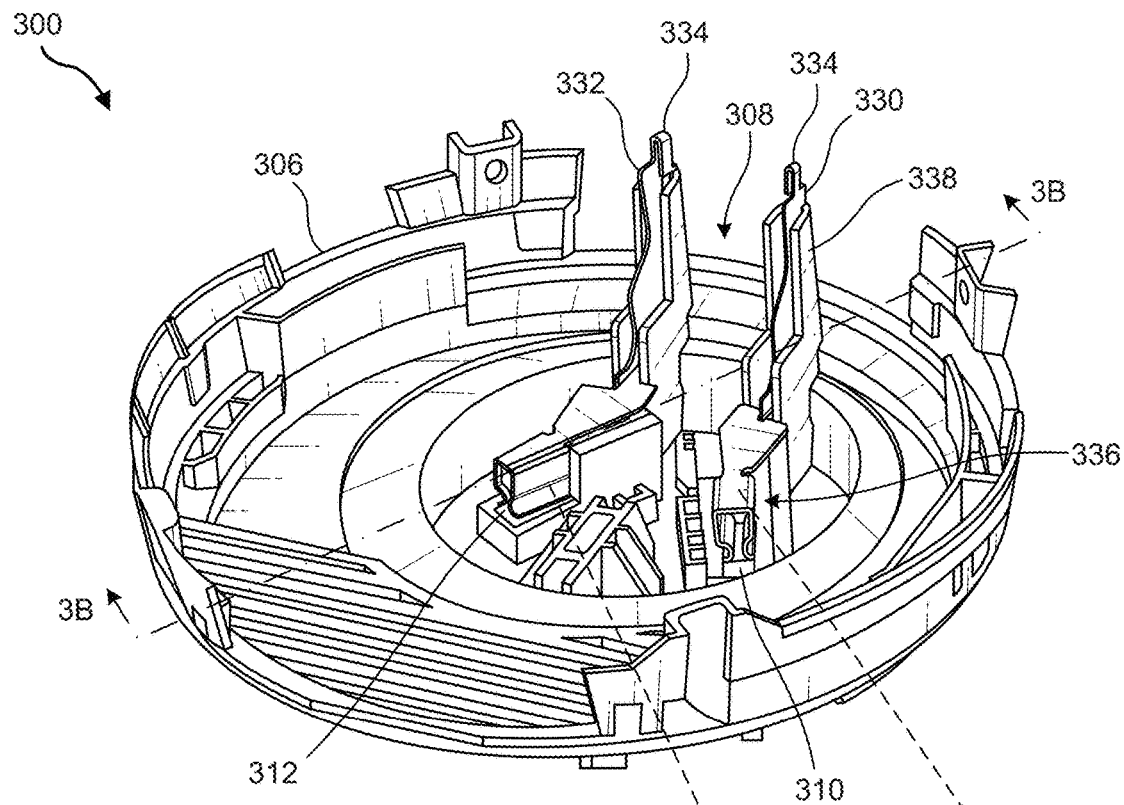
FIG. 3A
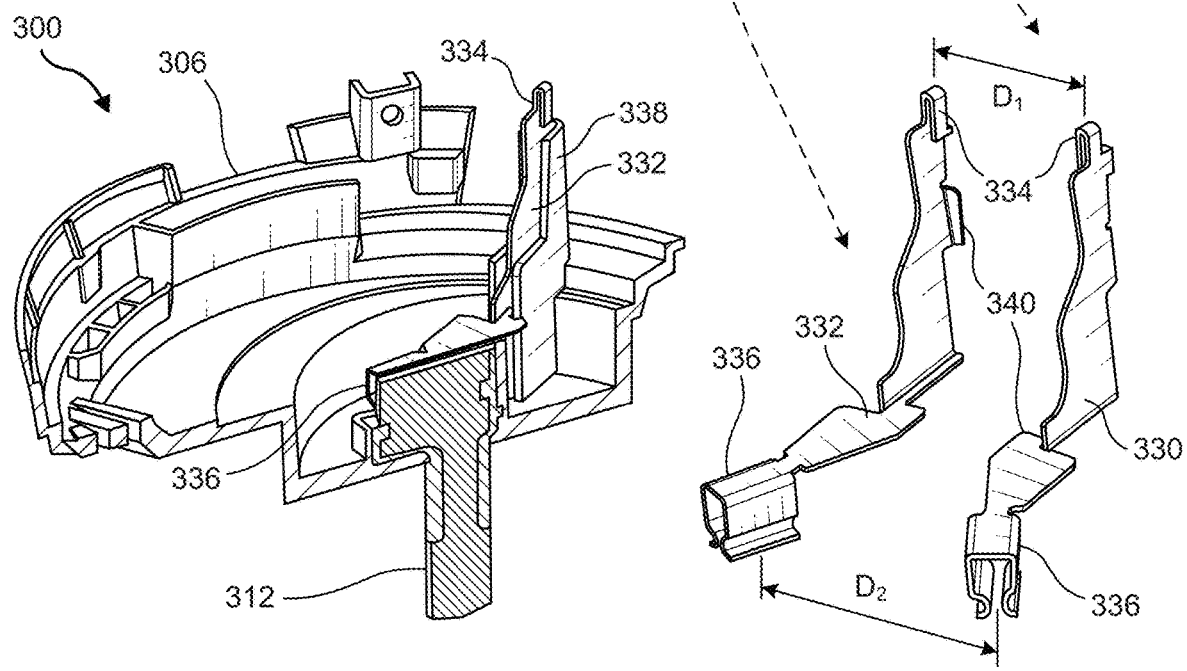
FIG. 3B
FIG. 3C

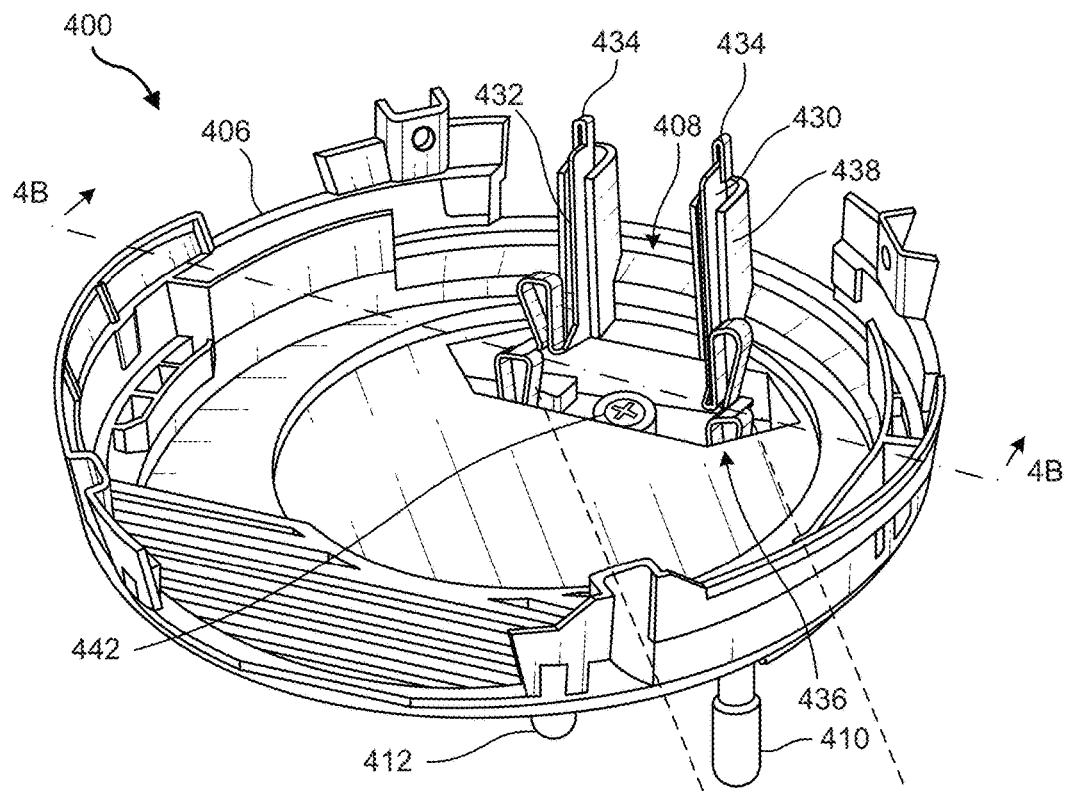
FIG. 4A
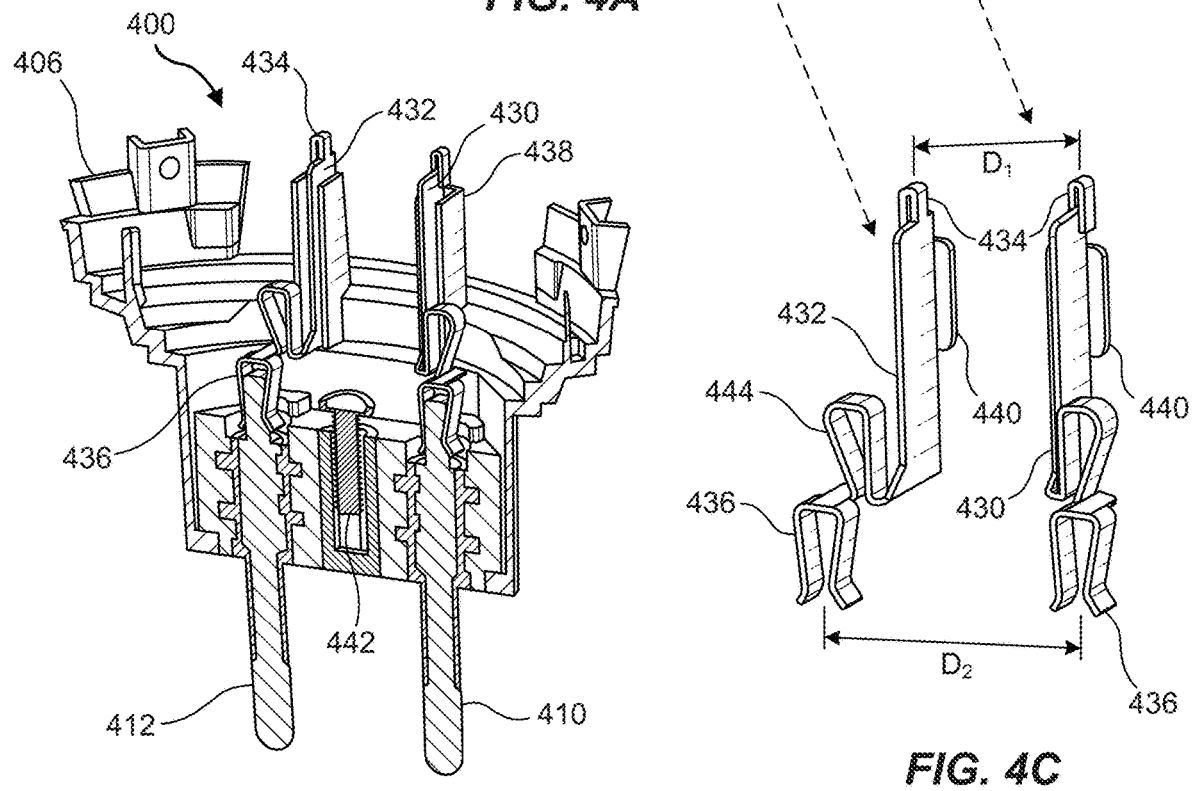
FIG. 4B
FIG. 4C

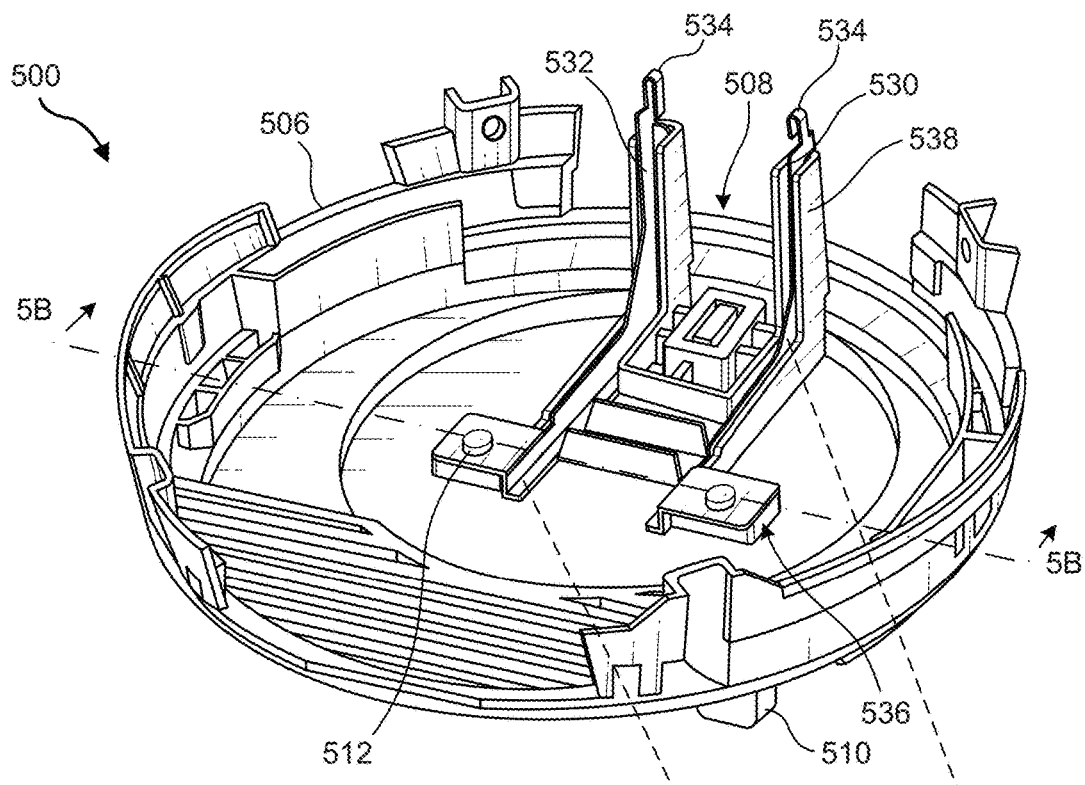
FIG. 5A
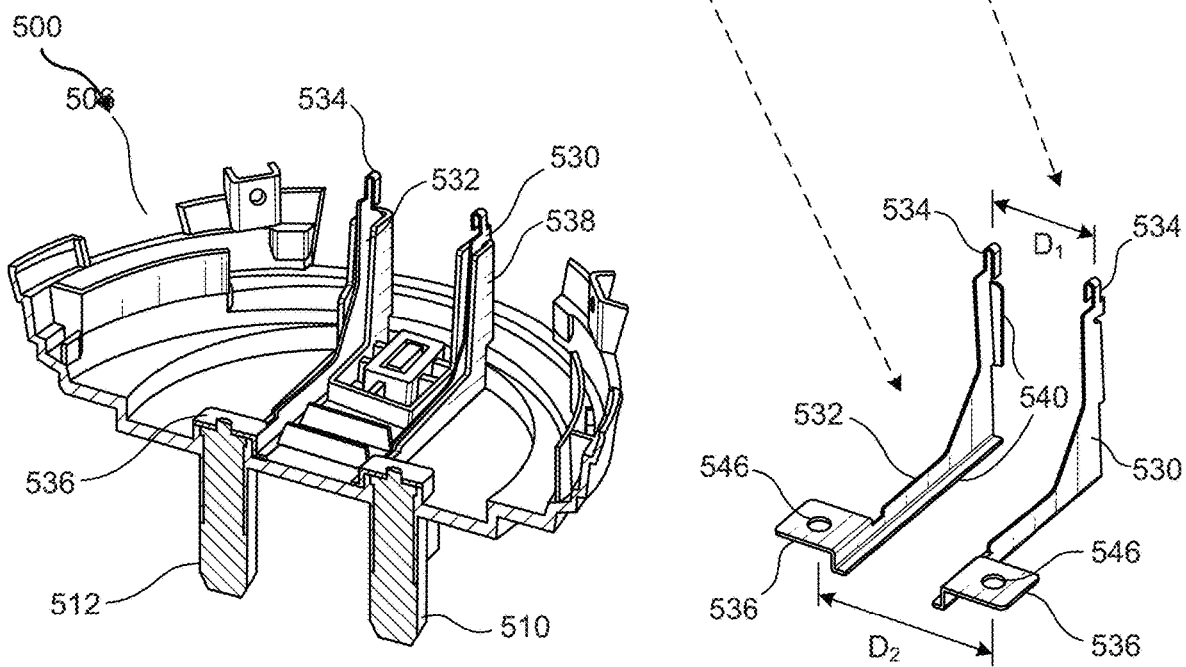
FIG. 5B
FIG. 5C

POWER BOARD DESIGN TO ACCOMMODATE UNIVERSAL PLUG TYPES VIA BRIDGE SHEET METAL DESIGNS

BRIEF DESCRIPTION OF THE DRAWINGS

FIG. 3A is a top perspective view of a housing cover of a wireless communication device including a first conductive pin structure arrangement, according to at least one embodiment of the present disclosure. FIG. 3B is a cross-sectional perspective view of the housing cover, taken from line 3B-3B in FIG. 3A. FIG. 3C is a perspective view of sheet metal connectors of the housing cover of FIGS. 3A and 3B.

FIG. 4A is a top perspective view of a power cover of a wireless communication device including a second conductive pin structure arrangement, according to at least one embodiment of the present disclosure. FIG. 4B is a cross-sectional perspective view of the power cover, taken from line 4B-4B in FIG. 4A. FIG. 4C is a perspective view of sheet metal connectors of the power cover of FIGS. 4A and 4B.

FIG. 5A is a top perspective view of a power cover of a wireless communication device including a first conductive pin structure arrangement, according to at least one embodiment of the present disclosure. FIG. 5B is a cross-sectional perspective view of the power cover, taken from line 5B-5B in FIG. 5A. FIG. 5C is a perspective view of sheet metal connectors of the power cover of FIGS. 5A and 5B.

Figure 1:
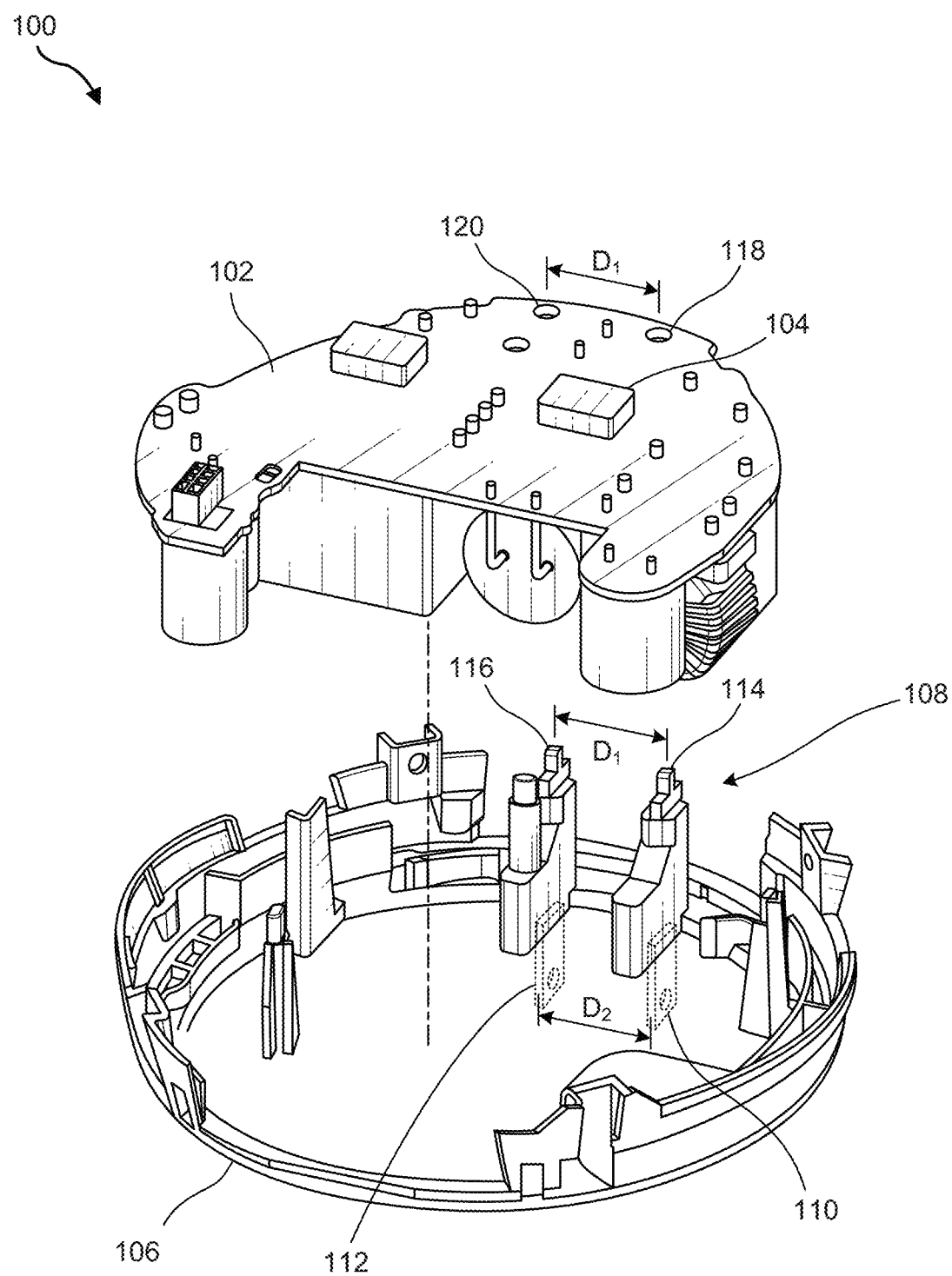
FIG. 1 is an exploded perspective view of a portion of a wireless communication device, according to at least one embodiment of the present disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION

Electrical devices may include integrated plugs for providing electrical power to the functional components of the electrical devices. Many different geographical regions have different standards for plug geometry and configuration. Wireless communication devices may include built-in plugs that are customized for use in these different geographical regions. Internal printed circuit boards and other components may need to be customized for use in each region due to the different standard plug configurations. These customizations can be expensive and burdensome to implement since a variety of printed circuit board layouts and manufacturing runs may be required. Additionally, economies of scale may be reduced, since smaller batches of regional printed circuit boards may be fabricated rather than a single printed circuit board design for many different regions.

The present disclosure provides detailed descriptions of wireless communication devices. As will be explained in greater detail below, embodiments of the present disclosure may include wireless communication devices (e.g., wireless extenders) that may include a printed circuit board, a conductive pin structure, and sheet metal connectors that electrically connect the conductive pin structure to power inputs of the printed circuit board. As explained below, the sheet metal connectors may be tailored to connect conductive pin structures of different configurations (e.g., different regional standard configurations) to the printed circuit board. The printed circuit board may have a common configuration regardless of the region, such as a neutral power input and a live power input that are positioned a common distance from each other. Thus, the sheet metal connectors may enable the use of a single printed circuit board design with multiple different conductive pin structures.

Features from any of the embodiments described herein may be used in combination with one another in accordance with the general principles described herein. These and other embodiments, features, and advantages will be more fully understood upon reading the following detailed description in conjunction with the accompanying drawings and claims.

Figure 6:
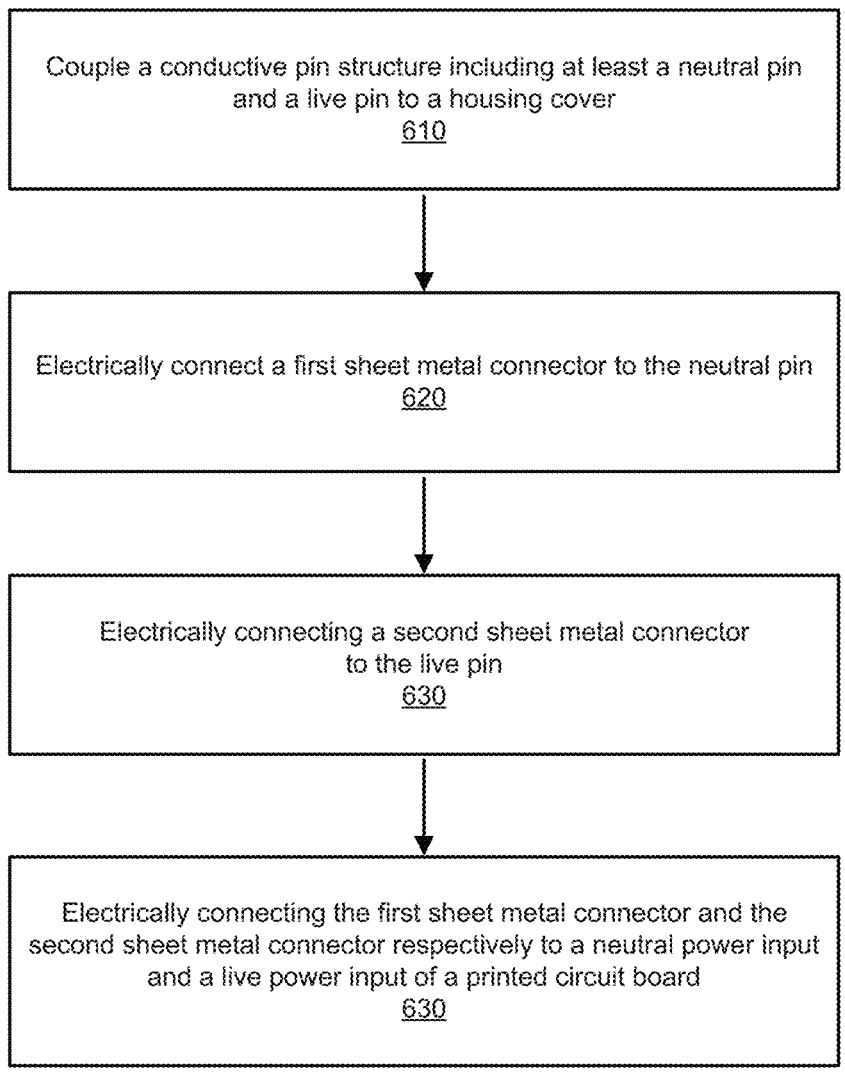
FIG. 6 is a flow diagram illustrating a method of fabricating a wireless communication device, according to at least one embodiment of the present disclosure.

The following will provide, with reference to FIGS. 1-5C, detailed descriptions of various wireless communication devices and components thereof. With reference to FIG. 6, the following will provide detailed descriptions of an example method of fabricating a wireless device.

FIG. 1 is an exploded perspective view of a portion of a wireless communication device 100, according to at least one embodiment of the present disclosure. The wireless communication device 100 may be a wireless extender, although the present disclosure is not limited to wireless extenders.

The wireless communication device 100 may include a printed circuit board 102, such as a power board for providing electrical power to the wireless communication device 100. The printed circuit board 102 may include components for operation of the wireless communication device 100, such as a wireless communication element 104 (e.g., a transceiver) configured to transmit and/or receive a wireless signal. Alternatively, the wireless communication element 104 may be located in a different section of the wireless communication device 100. In either case, electrical power for operation of the wireless communication element 104 may be provided by the printed circuit board 102.

The wireless communication device 100 may also include a housing cover 106 (e.g., a rear housing cover) configured to at least partially support and/or cover the printed circuit board 102. A conductive pin structure 108, including at least a neutral pin 110 and a live pin 112 (e.g., for engaging with an electrical outlet), may be coupled to and supported by the housing cover 106. The conductive pin structure 108 may also include a neutral conductive terminal 114 and a live conductive terminal 116 opposite the neutral pin 110 and live pin 112, respectively.

The neutral conductive terminal 114 and the live conductive terminal 116 may be shaped and sized to engage with the printed circuit board 102 to provide power to the printed circuit board 102 from the neutral pin 110 and live pin 112. For example, the printed circuit board 102 may include a neutral power input 118 for engaging with the neutral conductive terminal 114. The printed circuit board 102 may also include a live power input 120 for engaging with the live conductive terminal 116.

The neutral conductive terminal 114 and live conductive terminal 116 of the conductive pin structure 108 may be sized to be positioned within the respective neutral power input 118 and live power input 120 of the printed circuit board 102.

The relative positioning of the neutral conductive terminal 114 and live conductive terminal 116 may coincide with the relative positioning of the neutral power input 118 and live power input 120. For example, the neutral power input 118 and the live power input 120 may include through-holes that may be positioned at a first distance $D_1$ from each other, center-to-center. The neutral conductive terminal 114 and live conductive terminal 116 may also be positioned at the first distance $D_1$ from each other, center-to-center, to fit in the through-holes of the neutral power input 118 and live power input 120. Additionally, each of the neutral conductive terminal 114 and live conductive terminal 116 may be sized to abut against an inner surface of the through-holes to electrically couple to the printed circuit board 102. In some embodiments, the through-holes may include a conductive liner or other structure for physically abutting and electrically connecting to the neutral conductive terminal 114 and live conductive terminal 116. Optionally, the electrical and/or physical connection between the neutral conductive terminal 114 and live conductive terminal 116 and the neutral power input 118 and live power input 120 may be improved by soldering.

In some examples, relational terms, such as "first," "second," "top," "bottom," "rear," etc., may be used for clarity and convenience in understanding the disclosure and accompanying drawings and do not connote or depend on any specific preference, orientation, or order, except where the context clearly indicates otherwise.

The neutral pin 110 and live pin 112 may be positioned at a second distance $D_2$ from each other. For certain conductive pin structures 108, such as for a standard United States or Japanese electrical plug configuration, the second distance $D_2$ may be the same as the first distance $D_1$. In other words, the first distance $D_1$ between the neutral power input 118 and live power input 120 of the printed circuit board 102 may be selected to substantially match the second distance $D_2$ of a common distance between the neutral pin 110 and live pin, such as of the standard United States and Japanese electrical plug configuration.

For example, the second distance $D_2$ (center-to-center) may be between 0.40 inch and 0.60 inch, such as about 0.5 inch, in a standard United States and Japanese electrical plug configuration. The first distance $D_1$ between the neutral power input 118 and live power input 120, and between the neutral conductive terminal 114 and live conductive terminal 116, may also be about 0.5 inch (center-to-center).

This configuration may facilitate formation of the conductive pin structure 108 and the engagement of the neutral conductive terminal 114 and live conductive terminal 116 with the printed circuit board 102. As explained further below, the first distance $D_1$ may be kept constant even if the second distance $D_2$ changes relative to the first distance $D_1$, such as due to regional standard differences. For example, standard Australian, European, and United Kingdom plug configurations may include a neutral pin 110 and live pin 112 positioned at a second distance $D_2$ that is different from (e.g., greater than) the second distance $D_2$ of a standard United States or Japanese plug configuration. However, by keeping the first distance $D_1$ substantially constant for different conductive pin structures 108, the physical layout of the neutral power input 118 and live power input 120 in the printed circuit board 102 may be kept constant, reducing a cost and complexity of tailoring wireless communication devices 100 for use in different countries or regions with different standard plug configurations.

As discussed further below with reference to FIGS. 2A-5C, embodiments of the present disclosure include conductive connectors (e.g., bent sheet metal conductive connectors) that may electrically connect the neutral pin 110 of the conductive pin structure 108 to the neutral power input 118 of the printed circuit board 102 and that may electrically connect the live pin 112 of the conductive pin structure 108 to the live power input 120 of the printed circuit board 102. These conductive connectors may be configured for making such an electrical connection for plug configurations with a second distance $D_2$ between the neutral pin 110 and live pin 112 that is, in some cases, different than the first distance $D_1$ between the neutral power input 118 and live power input 120. In some examples, the conductive connectors of the present disclosure may be relatively inexpensive to fabricate, such as by stamping, laser cutting, or otherwise processing sheet metal into tailored workpieces. Then the workpieces may be bent into a shape for installing in the housing cover 106 to form a conductive path between the printed circuit board 102 and the neutral pin 110 and live pin 112.

For purposes of describing and defining the present disclosure, it is noted that relative terms, such as "about," "substantially," and the like, may be utilized herein to represent an inherent degree of uncertainty that may be attributed to any quantitative comparison, value, measurement, or other representation. These terms can also be utilized herein to represent the degree by which a quantitative representation may vary from a stated reference without resulting in a change in the basic function of the subject matter at issue.

FIGS. 2A-2D are bottom perspective views of example housing covers 200A-200D, including various conductive pin structures 208A-208D, for wireless communication devices, according to various embodiments of the present disclosure.

Figure 2A:
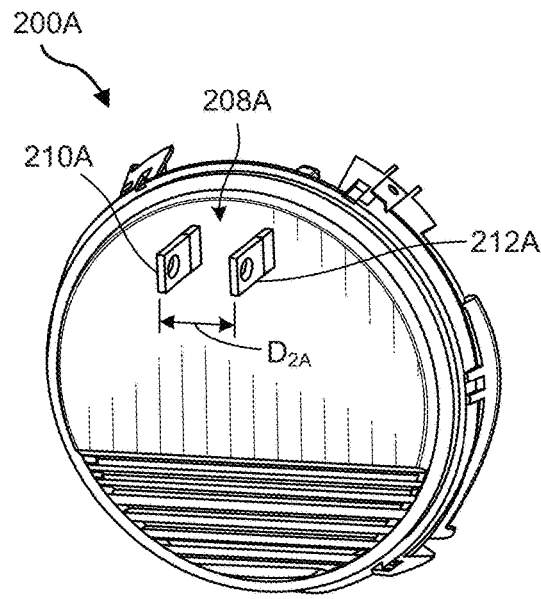
FIGS. 2A-2D are bottom perspective views of example housing covers, including various conductive pin structures, for wireless communication devices, according to various embodiments of the present disclosure.

FIG. 2A illustrates a housing cover 200A including a conductive pin structure 208A for use in the United States or Japan. For example, a neutral pin 210A and a live pin 212B of the conductive pin structure 208A may be positioned at a second distance $D_{2A}$ (center-to-center) from each other that is substantially the same as the first distance $D_1$ between a neutral power input 118 and live power input 120 of the printed circuit board 102 (see FIG. 1).

Figure 2B:
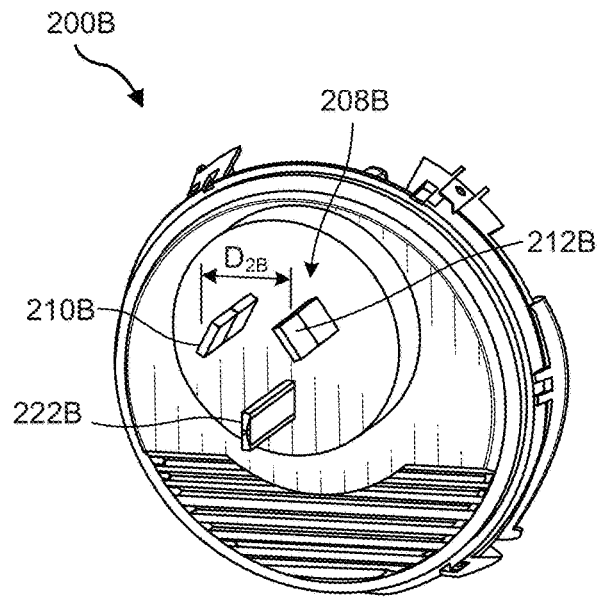

FIG. 2B illustrates a housing cover 200B including a conductive pin structure 208B for use in Australia. For example, a neutral pin 210B and a live pin 212B of the conductive pin structure 208B may be positioned at a second distance $D_{2B}$ (center-to-center) from each other that is different from (e.g., greater than) the first distance $D_1$ between a neutral power input 118 and live power input 120 of the printed circuit board 102 (see FIG. 1). In addition, the position and angle of the neutral pin 210B and live pin 212B for use in Australia relative to the housing cover 200B may be different from the relative position and angle of the conductive pin structure 208A for use in the United States and Japan. Additionally, the conductive pin structure 208B for use in Australia may include a ground pin 222B.

Figure 2C:
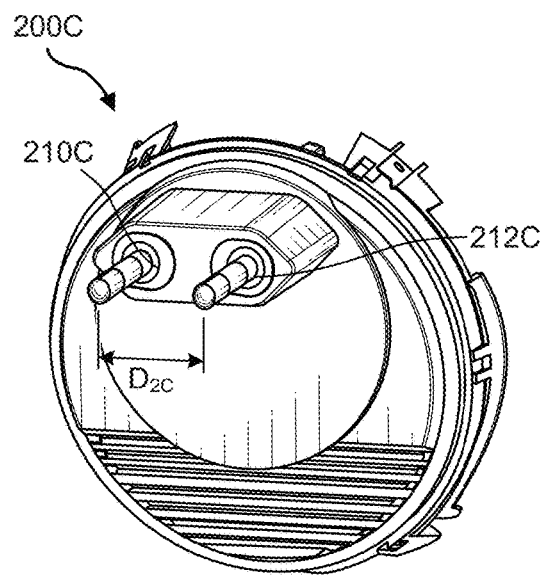

FIG. 2C illustrates a housing cover 200C including a conductive pin structure 208C for use in the European Union. For example, a neutral pin 210C and a live pin 212C of the conductive pin structure 208C may be positioned at a second distance $D_{2C}$ (center-to-center) from each other that is different from (e.g., greater than) the first distance $D_1$ between a neutral power input 118 and live power input 120 of the printed circuit board 102 (see FIG. 1). In addition, the position of the neutral pin 210C and live pin 212C for use in the European Union relative to the housing cover 200C may be different from the relative position of the conductive pin structure 208A for use in the United States and Japan. Additionally, the shape of the neutral pin 210C and live pin 212C for use in the European Union may be different from the shape of the neutral pin 210A and live pin 212A for use in the United States and Japan.

Figure 2D:
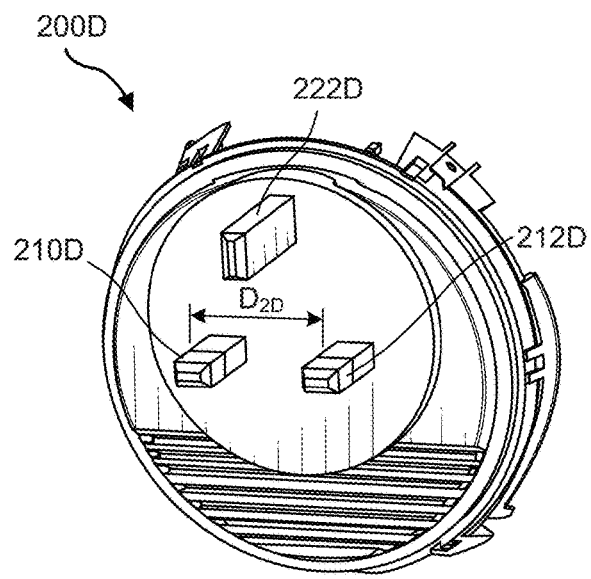

FIG. 2D illustrates a housing cover 200D including a conductive pin structure 208D for use in the United Kingdom. For example, a neutral pin 210D and a live pin 212D of the conductive pin structure 208D may be positioned at a second distance $D_{2D}$ (center-to-center) from each other that is different from (e.g., greater than) the first distance $D_1$ between a neutral power input 118 and live power input 120 of the printed circuit board 102 (see FIG. 1). In addition, the position of the neutral pin 210D and live pin 212D for use in the United Kingdom relative to the housing cover 200D may be different from the relative position of the conductive pin structure 208A for use in the United States and Japan. Additionally, the shape of the neutral pin 210D and live pin 212D for use in the United Kingdom may be different from the shape of the neutral pin 210A and live pin 212A for use in the United States and Japan. The conductive pin structure 208D for use in the United Kingdom may also include a ground pin 222D.

Accordingly, wireless communication devices of the present disclosure may include housing covers 206A-208D with different respective conductive pin structures 208A-208D tailored for use in different geographical regions. The four configurations for four respective geographical regions illustrated in FIGS. 2A-2D are shown by way of example and not limitation. Additional example housing covers of the present disclosure may be fabricated with other conductive pin structure configurations for use in other geographical regions having various standard plug configurations. Any of these different housing cover configurations may be used with a common printed circuit board layout design, which may have a neutral power input and live power input positioned in a common location and at a common distance from each other.

FIG. 3A is a top perspective view of a housing cover 306 of a wireless communication device 300 including a first conductive pin structure 308 arrangement, according to at least one embodiment of the present disclosure. FIG. 3B is a cross-sectional perspective view of the housing cover 306, taken from line 3B-3B in FIG. 3A. FIG. 3C is a perspective view of sheet metal connectors 330, 332 of the housing cover 306 of FIGS. 3A and 3B.

By way of illustration, the first conductive pin structure 308 may have a standard Australian plug configuration, like the configuration shown in FIG. 2B. The first conductive pin structure 308 may include a neutral pin 310 and a live pin 312, which may be insert-molded to the housing cover 306 as illustrated in FIG. 3B. In additional examples, the neutral pin 310 and live pin 312 may be secured to the housing cover 306 in other ways, such as with a fastener (e.g., a clip, a pin, a bolt, etc.), an adhesive, and/or the like.

A first sheet metal connector 330 may be coupled to an internal end portion of the neutral pin 310 and a second sheet metal connector 332 may be coupled to an internal end portion of the live pin 312. The first and second sheet metal connectors 330, 332 may be shaped and positioned to connect the neutral pin 310 and live pin 312 to a respective neutral power input and live power input of a printed circuit board (e.g., the neutral power input 118 and live power input 120 of the printed circuit board 102 of FIG. 1). Thus, the first and second sheet metal connectors 330, 332 may act as bridges to respectively electrically connect the neutral pin to the neutral power input of the printed circuit board and the live pin to the live power input of the printed circuit board.

The first and second sheet metal connectors 330, 332 may include a first hemmed end 334 for engagement with the neutral and live power inputs of the printed circuit board. The first and second sheet metal connectors 330, 332 may also include a second end 336 including a connection feature coupled to the respective neutral pin 310 and live pin 312. As illustrated in FIGS. 3A-3C, the connection feature of the second end 336 may include a clamp bend for clamping over the internal end portions of the neutral pin 310 and live pin 312. Optionally, the connection between the first and second sheet metal connectors 330, 332 and the neutral pin 310 and live pin 312 may be further improved by soldering, welding, applying a conductive adhesive, and/or securing with a fastener (e.g., a blot, screw, pin, clip, etc.).

The first and second sheet metal connectors 330, 332 may each be formed of a single, unitary bent sheet metal element. In some examples, this configuration may reduce a material and manufacturing cost of the first and second sheet metal connectors 330, 332 compared to other configurations.

As shown in FIGS. 3A and 3B, the housing cover 306 may include a support structure 338 for supporting and positioning the first and second sheet metal connectors 330, 332. The support structures 338 may include channels within which the first and second sheet metal connectors 330, 332 may be positioned. The first hemmed ends 334 of the first and second sheet metal connectors 330, 332 may be held at a first distance $D_1$ (center-to-center) from each other, which may coincide with a distance between the neutral power input and live power input of a corresponding printed circuit board, as described above with reference to FIG. 1. The second ends 336 of the first and second sheet metal connectors 330, 332 may be held at a second distance $D_2$ (center-to-center) from each other, which may correspond to a distance between the neutral pin 310 and live pin 312 of the conductive pin structure 308. The second distance $D_2$ may be different from the first distance $D_1$. Thus, the shape and bends of the first and second sheet metal connectors 330, 332 may be configured to extend from the second ends 336 engaging the neutral pin 310 and live pin 312 at the second distance $D_2$ to the first ends 334 engaging the neutral power input and live power input of a printed circuit board at the first distance $D_1$.

The first and second sheet metal connectors 330, 332 may also include engagement features 340 (FIG. 3C) for engaging with the support structure 338 of the housing cover 306. For example, the engagement features 340 may include notches, tabs, extensions, curves, holes, corners, and/or the like. The support structure 338 may include complementary features, such as slots, extensions, tabs, notches, etc., to facilitate coupling the first and second sheet metal connectors 330, 332 to the support structure 338.

FIG. 4A is a top perspective view of a housing cover 406 of a wireless communication device 400 including a second conductive pin structure 408 arrangement, according to at least one embodiment of the present disclosure. FIG. 4B is a cross-sectional perspective view of the housing cover 406, taken from line 4B-4B in FIG. 4A. FIG. 4C is a perspective view of sheet metal connectors 430, 432 of the housing cover 406 of FIGS. 4A and 4B.

In some respects, the wireless communication device 400 and components thereof as shown in FIGS. 4A-4C may be similar to the wireless communication device 300 of FIGS. 3A-3C. For example, the wireless communication device may include the housing cover 406 to which the second conductive pin structure 408 may be coupled. A first sheet metal connector 430 may electrically connect a neutral pin 410 of the second conductive pin structure 408 to a neutral power input of a printed circuit board (e.g., the neutral power input 118 of the printed circuit board 102 of FIG. 1). A second sheet metal connector 432 may electrically connect a live pin 412 of the second conductive pin structure 408 to a live power input of the printed circuit board (e.g., the live power input 120 of the printed circuit board 102 of FIG. 1).

The first and second sheet metal connectors 430, 432 may include a first hemmed end 434 for engagement with the neutral and live power inputs of the printed circuit board and a second end 436 including a connection feature coupled to the respective neutral pin 410 and live pin 412. For example, the connection feature of the second end 436 may include a clamp bend in the first and second sheet metal connectors 430, 432.

The housing cover 406 may include a support structure 438 for supporting and positioning the first and second sheet metal connectors 430, 432. The support structures 438 may include channels within which the first and second sheet metal connectors 430, 432 may be positioned. The first hemmed ends 434 of the first and second sheet metal connectors 430, 432 may be held at a first distance $D_1$ (center-to-center) from each other and the second ends 436 of the first and second sheet metal connectors 430, 432 may be held at a second distance $D_2$ (center-to-center) from each other. The second distance $D_2$, may correspond to a distance between the neutral pin 410 and live pin 412. The second distance $D_2$ may be different from the first distance $D_1$. Thus, the shape and bends of the first and second sheet metal connectors 430, 432 may be configured to extend from the second ends 436 engaging the neutral pin 410 and live pin 412 at the second distance $D_2$ to the first ends 434 engaging the neutral power input and live power input of a printed circuit board at the first distance $D_1$.

Engagement features 440 (FIG. 4C) of the first and second sheet metal connectors 430, 432 may be shaped and positioned for engaging with the support structure 438 of the housing cover 406. The support structure 438 may include complementary features to facilitate coupling the first and second sheet metal connectors 430, 432 to the support structure 438.

By way of illustration, the second conductive pin structure 408 may have a standard European Union plug configuration, like the configuration shown in FIG. 2C.

As illustrated in FIGS. 4A and 4B, the neutral pin 410 and the live pin 412 of the conductive pin structure 408 may be coupled to the housing cover 406 with a fastener 442, such as a bolt, pin, clip, or the like.

As illustrated in FIG. 4C, in some examples the first and second sheet metal connectors 430, 432 may each include a relief bend 444, which may facilitate adjusting the position of the second ends 436 to engage with the internal ends of the respective neutral pin 410 and live pin 412 during assembly.

FIG. 5A is a top perspective view of a housing cover 506 of a wireless communication device 500 including a third conductive pin structure 508 arrangement, according to at least one embodiment of the present disclosure. FIG. 5B is a cross-sectional perspective view of the housing cover 506, taken from line 5B-5B in FIG. 5A. FIG. 5C is a perspective view of sheet metal connectors 530, 532 of the housing cover 506 of FIGS. 5A and 5B.

In some respects, the wireless communication device 500 and components thereof as shown in FIGS. 5A-5C may be similar to the wireless communication devices 300, 400 of FIGS. 3A-3C and FIGS. 4A-4C. For example, the wireless communication device may include the housing cover 506 to which the second conductive pin structure 508 may be coupled (e.g., via insert molding). A first sheet metal connector 530 may electrically connect a neutral pin 510 of the second conductive pin structure 508 to a neutral power input of a printed circuit board (e.g., the neutral power input 118 of the printed circuit board 102 of FIG. 1). A second sheet metal connector 532 may electrically connect a live pin 512 of the second conductive pin structure 508 to a live power input of the printed circuit board (e.g., the live power input 120 of the printed circuit board 102 of FIG. 1).

The first and second sheet metal connectors 530, 532 may include a first hemmed end 534 for engagement with the neutral and live power inputs of the printed circuit board and a second end 536 including a connection feature coupled to the respective neutral pin 510 and live pin 512. For example, the connection feature of the second end 536 may include a hole 546 in the first and second sheet metal connectors 530, 532, which may be secured to the respective neutral pin 510 and live pin 512, such as via a riveted connection.

The housing cover 506 may include a support structure 538 for supporting and positioning the first and second sheet metal connectors 530, 532. The support structures 538 may include channels within which the first and second sheet metal connectors 530, 532 may be positioned. The first hemmed ends 534 of the first and second sheet metal connectors 530, 532 may be held at a first distance $D_1$ (center-to-center) from each other and the second ends 436 of the first and second sheet metal connectors 530, 532 may be held at a second distance $D_2$ (center-to-center) from each other. The second distance $D_2$, may correspond to a distance between the neutral pin 510 and live pin 512. The second distance $D_2$ may be different from the first distance $D_1$. Thus, the shape and bends of the first and second sheet metal connectors 530, 532 may be configured to extend from the second ends 536 engaging the neutral pin 510 and live pin 512 at the second distance $D_2$ to the first ends 534 engaging the neutral power input and live power input of a printed circuit board at the first distance $D_1$.

Engagement features 540 (FIG. 5C) of the first and second sheet metal connectors 530, 532 may be shaped and positioned for engaging with the support structure 538 of the housing cover 506. The support structure 538 may include complementary features to facilitate coupling the first and second sheet metal connectors 530, 532 to the support structure 538.

By way of illustration, the second conductive pin structure 508 may have a standard United Kingdom plug configuration, like the configuration shown in FIG. 2D.

FIG. 6 is a flow diagram illustrating a method 600 of fabricating a wireless communication device, according to at least one embodiment of the present disclosure. At operation 610, a conductive pin structure including at least a neutral pin and a live pin may be coupled to a housing cover. Operation 610 may be performed in a variety of ways. For example, the neutral pin and live pin may be insert molded, bolted, riveted, adhered, or otherwise secured to the housing cover.

At operation 620, a first sheet metal connector may be electrically connected to the neutral pin. Operation 620 may be performed in a variety of ways. For example, the first sheet metal connector may be bolted, adhered, welded, soldered, pinned, and/or riveted to an internal end of the neutral pin. In some embodiments, an end portion of the first sheet metal connector may be bent into a clamp shape to physically and electrically couple to the internal end of the neutral pin.

At operation 630, a second sheet metal connector may be electrically connected to the live pin. Operation 630 may be performed in a variety of ways. For example, the second sheet metal connector may be clamped, bolted, adhered, welded, soldered, pinned, and/or riveted to an internal end of the live pin. In some embodiments, an end portion of the second sheet metal connector may exhibit a clamp shape to physically and electrically couple to the internal end of the live pin. In this case, the first sheet metal connector may clamp the neutral pin and the second sheet metal connector may clamp the live pin.

In some examples, operations 620 and 630 may be simultaneously performed.

At operation 640, the first sheet metal connector and the second sheet metal connector may be connected to, respectively, a neutral power input and a live power input of a printed circuit board (e.g., a power board). Operation 640 may be performed in a variety of ways. For example, an end portion (e.g., a hemmed end portion) of the first and second sheet metal connectors may be inserted within a respective neutral through hole and live through hole of the printed circuit board. The neutral power input and a live power input may be separated from each other a first distance. In some embodiments, the neutral pin and the live pin of the conductive pin structure may be separated from each other a second, different (e.g., greater) distance.

Accordingly, the present disclosure includes wireless communication devices, components thereof, and related methods that may improve existing wireless communication devices. For example, the wireless communication devices of the present disclosure may include printed circuit boards that have a neutral power input and live power input that are positioned a common distance from each other (e.g., about 0.5 inch). These printed circuit boards may be used in various countries and regions with different standard plug configurations by providing a housing cover adapted for the different standard plug configurations. Bent sheet metal connectors may be used for electrical routing from the different standard plug configurations to the neutral power input and live power input of the printed circuit board. This configuration may enable the use of the same or similar printed circuit boards in the various different countries and regions at a low cost.

The following example embodiments are also included in the present disclosure.

Example 1: A wireless communication device, which may include: a printed circuit board having a neutral power input and a live power input, the neutral power input positioned in the printed circuit board at a first distance from the live power input; a conductive pin structure including at least a neutral pin and a live pin, the neutral pin positioned at a second, different distance from the live pin; a first sheet metal connector electrically connecting the neutral pin to the neutral power input; and a second sheet metal connector electrically connecting the live pin to the live power input.

Example 2: The wireless communication device of Example 1, wherein: the first sheet metal connector comprises a first single, unitary bent sheet metal element; and the second sheet metal connector comprises a second single, unitary bent sheet metal element.

Example 3: The wireless communication device of Example 1 or Example 2, wherein the second distance is greater than the first distance.

Example 4: The wireless communication device of any of Examples 1 through 3, wherein the first distance is between 0.40 inch and 0.60 inch.

Example 5: The wireless communication device of Example 4, wherein the first distance is about 0.5 inch.

Example 6: The wireless communication device of any of Examples 1 through 5, wherein each of the first sheet metal connector and the second sheet metal connector comprises: a first hemmed end for coupling to the respective neutral power input or live power input; and a second end comprising a connection feature for coupling to the respective neutral pin or live pin.

Example 7: The wireless communication device of Example 6, wherein the connection feature comprises at least one of: a hole; or a clamp bend.

Example 8: The wireless communication device of Example 6 or Example 7, wherein the connection feature is secured to the respective neutral pin or live pin with a solder, a weld, a conductive adhesive, or a fastener.

Example 9: The wireless communication device of any of Examples 1 through 8, wherein the conductive pin structure exhibits one of: a standard Australian plug configuration; a standard European plug configuration; or a standard United Kingdom plug configuration.

Example 10: The wireless communication device of any of Examples 1 through 9, further comprising a housing cover configured to at least partially support the printed circuit board, wherein the conductive pin structure is coupled to the housing cover.

Example 11: The wireless communication device of Example 10, wherein the conductive pin structure is insert molded to the housing cover.

Example 12: The wireless communication device of Example 10 or Example 11, wherein the conductive pin structure is fixed to the housing cover with a fastener.

Example 13: The wireless communication device of any of Examples 1 through 12, wherein the conductive pin structure further comprises a ground pin.

Example 14: A wireless communication device, which may include: a wireless communication element configured to at least one of transmit or receive a wireless signal; a printed circuit board having a neutral power input and a live power input, the neutral power input positioned in the printed circuit board at a first distance from the live power input; a housing cover configured to at least partially support the printed circuit board; a conductive pin structure coupled to the housing cover, the conductive pin structure including at least a neutral pin and a live pin, the neutral pin positioned at a second, greater distance from the live pin; a first bent sheet metal connector electrically connecting the neutral pin to the neutral power input; and a second bent sheet metal connector electrically connecting the live pin to the live power input.

Example 15: The wireless communication of any of Example 14, wherein each of the first bent sheet metal connector and the second bent sheet metal connector comprises: a first hemmed end for coupling to the respective neutral power input or live power input; and a second end comprising a connection feature for coupling to the respective neutral pin or live pin.

Example 16: The wireless communication of Example 15, wherein the first distance is about 0.5 inch.

Example 17: A method of fabricating a wireless communication device, which may include: coupling a conductive pin structure including at least a neutral pin and live pin to a housing cover; electrically connecting a first sheet metal connector to the neutral pin; electrically connecting a second sheet metal connector to the live pin; and electrically connecting the first sheet metal connector and the second sheet metal connector respectively to a neutral power input and a live power input of a printed circuit board, the neutral power input positioned in the printed circuit board at a first distance from the live power input, wherein the neutral pin is positioned a second, different distance from the live pin.

Example 18: The method of Example 17, wherein coupling the conductive pin structure to the housing cover comprises coupling, to the housing cover, a conductive pin structure exhibiting one of: a standard Australian plug configuration; a standard European plug configuration; or a standard United Kingdom plug configuration.

Example 19: The method of Example 17 or Example 18, wherein: electrically connecting the first sheet metal connector to the neutral pin comprises clamping the neutral pin with the first sheet metal connector; and electrically connecting the second sheet metal connector to the live pin comprises clamping the live pin with the second sheet metal connector.

Example 20: The method of any of Examples 17 through 19, wherein electrically connecting the first sheet metal connector and the second sheet metal connector respectively to the neutral power input and the live power input of the printed circuit board comprises: inserting a first hemmed end of the first sheet metal connector into a neutral through hole; and inserting a second hemmed end of the second sheet metal connector into a live through hole.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A wireless communication device, comprising:
   a printed circuit board having a neutral power input and a live power input, the neutral power input positioned in the printed circuit board at a first distance from the live power input;
   a conductive pin structure including at least a neutral pin and a live pin, the neutral pin positioned at a second, different distance from the live pin;
   a first sheet metal connector electrically connecting the neutral pin to the neutral power input; and
   a second sheet metal connector electrically connecting the live pin to the live power input.

2. The wireless communication device of claim 1, wherein:
   the first sheet metal connector comprises a first single, unitary bent sheet metal element; and
   the second sheet metal connector comprises a second single, unitary bent sheet metal element.

3. The wireless communication device of claim 1, wherein the second distance is greater than the first distance.

4. The wireless communication device of claim 1, wherein the first distance is between 0.40 inch and 0.60 inch.

5. The wireless communication device of claim 4, wherein the first distance is about 0.5 inch.

6. The wireless communication device of claim 1, wherein each of the first sheet metal connector and the second sheet metal connector comprises:
   a first hemmed end for coupling to the respective neutral power input or live power input; and
   a second end comprising a connection feature for coupling to the respective neutral pin or live pin.

7. The wireless communication device of claim 6, wherein the connection feature comprises at least one of:
   a hole; or
   a clamp bend.

8. The wireless communication device of claim 6, wherein the connection feature is secured to the respective neutral pin or live pin with a solder, a weld, a conductive adhesive, or a fastener.

9. The wireless communication device of claim 1, wherein the conductive pin structure exhibits one of:
   a standard Australian plug configuration;
   a standard European plug configuration; or
   a standard United Kingdom plug configuration.

10. The wireless communication device of claim 1, further comprising a housing cover configured to at least partially support the printed circuit board, wherein the conductive pin structure is coupled to the housing cover.

11. The wireless communication device of claim 10, wherein the conductive pin structure is insert molded to the housing cover.

12. The wireless communication device of claim 10, wherein the conductive pin structure is fixed to the housing cover with a fastener.

13. The wireless communication device of claim 1, wherein the conductive pin structure further comprises a ground pin.

14. A wireless communication device, comprising:
    a wireless communication element configured to at least one of transmit or receive a wireless signal;

a printed circuit board having a neutral power input and a live power input, the neutral power input positioned in the printed circuit board at a first distance from the live power input;

a housing cover configured to at least partially support the printed circuit board;

a conductive pin structure coupled to the housing cover, the conductive pin structure including at least a neutral pin and a live pin, the neutral pin positioned at a second, greater distance from the live pin;

a first bent sheet metal connector electrically connecting the neutral pin to the neutral power input; and a second bent sheet metal connector electrically connecting the live pin to the live power input.

15. The wireless communication device of claim 14, wherein each of the first bent sheet metal connector and the second bent sheet metal connector comprises:

a first hemmed end for coupling to the respective neutral power input or live power input; and a second end comprising a connection feature for coupling to the respective neutral pin or live pin.

16. The wireless communication device of claim 15, wherein the first distance is about 0.5 inch.

17. A method of fabricating a wireless communication device, the method comprising:

coupling a conductive pin structure including at least a neutral pin and live pin to a housing cover;

electrically connecting a first sheet metal connector to the neutral pin;

electrically connecting a second sheet metal connector to the live pin; and electrically connecting the first sheet metal connector and the second sheet metal connector respectively to a neutral power input and a live power input of a printed circuit board, the neutral power input positioned in the printed circuit board at a first distance from the live power input, wherein the neutral pin is positioned a second, different distance from the live pin.

18. The method of claim 17, wherein coupling the conductive pin structure to the housing cover comprises coupling, to the housing cover, a conductive pin structure exhibiting one of:

a standard Australian plug configuration;

a standard European plug configuration; or a standard United Kingdom plug configuration.

19. The method of claim 17, wherein:

electrically connecting the first sheet metal connector to the neutral pin comprises clamping the neutral pin with the first sheet metal connector; and electrically connecting the second sheet metal connector to the live pin comprises clamping the live pin with the second sheet metal connector.

20. The method of claim 17, wherein electrically connecting the first sheet metal connector and the second sheet metal connector respectively to the neutral power input and the live power input of the printed circuit board comprises:

inserting a first hemmed end of the first sheet metal connector into a neutral through hole; and inserting a second hemmed end of the second sheet metal connector into a live through hole.

\* \* \* \* \*